United States Patent [19]

Jensen

[11] 4,211,951

[45] Jul. 8, 1980

[54] SHEAR TYPE PRESTRESSED PIEZOELECTRIC FORCE TRANSDUCER

[75] Inventor: Joergen Jensen, Gentofte, Denmark

[73] Assignee: Bruel & Kjaer A/S, Naerum, Denmark

[21] Appl. No.: 941,060

[22] Filed: Sep. 11, 1978

Related U.S. Application Data

[63] Continuation of Ser. No. 780,456, Mar. 23, 1977, abandoned.

[30] Foreign Application Priority Data

Mar. 29, 1976 [DK] Denmark ............................ 1369/76

[51] Int. Cl.$^2$ ............................................ H01L 41/10

[52] U.S. Cl. .................................... 310/329; 310/333

[58] Field of Search ............. 310/329, 333; 340/17 R; 73/517 R

[56] References Cited

U.S. PATENT DOCUMENTS

| | | | |
|---|---|---|---|
| 3,075,099 | 1/1963 | Shoor | 310/329 |
| 3,536,939 | 10/1970 | Zeiringer | 310/329 |
| 3,727,084 | 4/1973 | Epstein | 310/329 |

*Primary Examiner*—Mark O. Budd

*Attorney, Agent, or Firm*—LeBlanc, Nolan, Shur & Nies

[57] ABSTRACT

An accelerometer having a base unit carrying one or more transducers and encapsulated in a housing. The base includes a base piece and a prism-shaped stud with a rectangular cross-section having shear sensitive transducing elements, with associated seismic masses, fixed on the opposite, wide faces of the stud. The stud is shaped like an inverted T, so that the cross-section of the lower T-bar part has the same thickness but a greater lateral dimension than the T-leg part which carries the transducing elements. The stud is affixed perpendicular to the base piece with high precision using the lower T-bar part of the stud as a guide, and is easily fastened to the base piece without the use of screws or cement.

4 Claims, 4 Drawing Figures

SHEAR TYPE PRESTRESSED PIEZOELECTRIC FORCE TRANSDUCER

CROSS-REFERENCE TO RELATED APPLICATION

This application is a continuation of application Ser. No. 780,456, filed Mar. 23, 1977.

BACKGROUND OF THE INVENTION

The invention concerns an accelerometer consisting of a transducing element and an encapsulation, which accelerometer has been designed for making accurate measurements of dynamic accelerations along a predetermined axis.

For the measurement of static and dynamic mechanical forces, electromechanical force-gauges are frequently utilized. In such gauges a change in electrical charge, voltage, current, or impedance is brought on by the forces to be measured.

Accelerometers, in which the acceleration of a seismic mass results in a mechanical force proportional to the acceleration are well known. The said force acts on a transducing element, e.g. a pressure-sensitive electrical resistor or semi-conductor or a piezo-electric element, resp. an electrodynamic system or any other known system for the conversion of mechanical energy into electrical energy.

The transducing elements may be acted on in the compression, bending, or shear modes and it has turned out that piezoelectric accelerometers working in the shear mode may be given advantageous properties, such as good linearity, low static and dynamic temperature coefficient, and an extended frequency range.

In a previously known construction of an accelerometer of the kind described, a base is provided, having a cylindrical stud, cemented or otherwise fastened to which there is a piezoelectric element shaped as a hollow cylinder, which element is surrounded by a seisic mass attached to it. The construction, being rotationally symmetric, ensures that the components of the accelerometer may be produced inexpensively, and with precision by turning and grinding. Furthermore the sensitivity to motion in directions perpendicular to the axis may be quite small. A weak point in this construction, however, lies in the poor bonding strength under temperature stresses of the joints between the cylindrical elements. The different temperature coefficients of expansion of these elements give rise to unwanted mechanical stresses.

In another, also known construction, the stud is shaped as a prism, the cross section of which is a regular polygon. The vertical faces of the prismatical stud carry flat transducing elements that are held in place by means of compression springs. Thus it is obtained that the stiffness of the stud is essentially the same in all directions perpendicular to the axis. A disadvantage of this construction lies in the difficulties in producing the stud and bonding it to the base plate when the size of the accelerometer is very small.

SUMMARY OF THE INVENTION

In an accelerometer according to the invention, the stud is prism-shaped with a rectangular cross-section having a number of shear sensitive transducing elements disposed on the opposite, wide faces of the stud. The shear sensitive transducing elements reflect the change in mechanical force by a corresponding change in electrical charge, voltage, current, or impedance. The stud, having a rectangular cross-section, is furthermore shaped like an inverted, capital T, so that the cross section of the lower part has the same thickness but a greater lateral dimension than the part carrying the transducing elements. Using the construction described, the stiffness is great in all directions perpendicular to the axis, and the transverse sensitivity of the accelerometer is low, as the stud may be affixed perpendicular to the base with high precision using the lower part of the stud as a guide. Through these provisions the stud may be cheaply manufactured and easily fastened to the base without the use of screws or cement.

The invention is to be further described with reference to the drawing of an embodiment of the invention, in which FIG. 1 shows an "exploded view" of the principal components of an accelerometer according to the invention.

Figure 1:
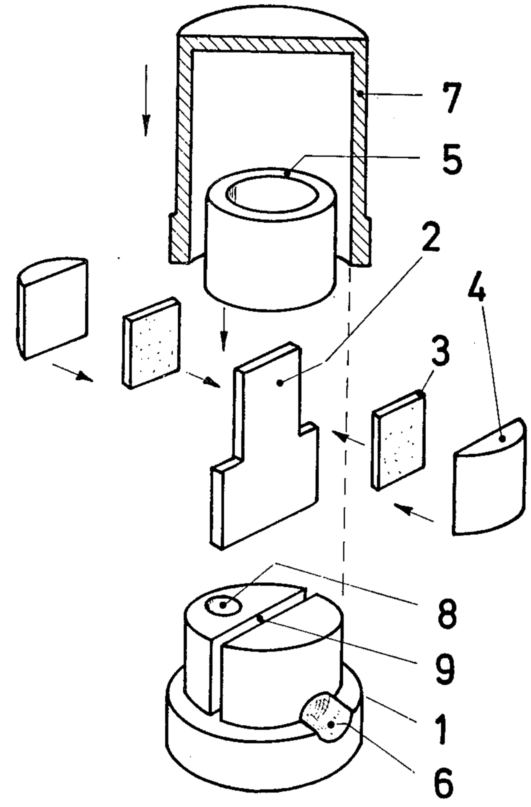
Figure 3:
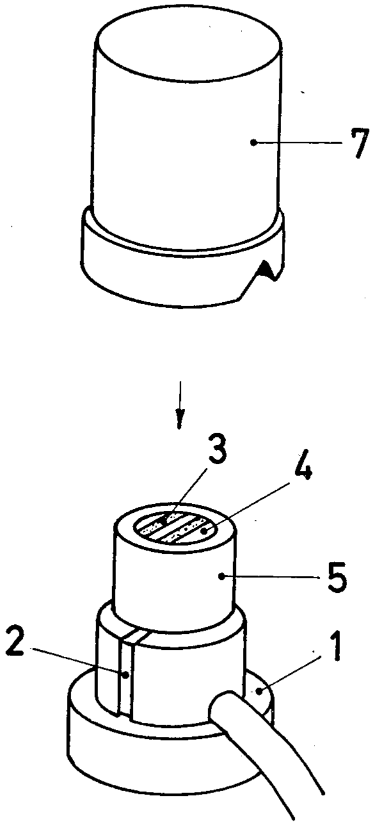
FIG. 3 shows the manner in which the outer case is to be fixed on the base.
Figure 2:
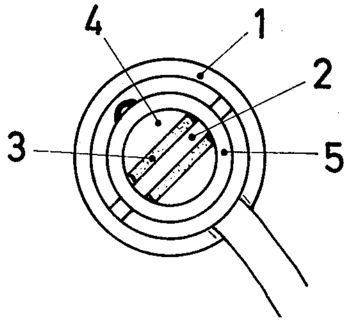
FIG. 2 shows complete accelerometer minus outer case viewed from above.
Figure 4:
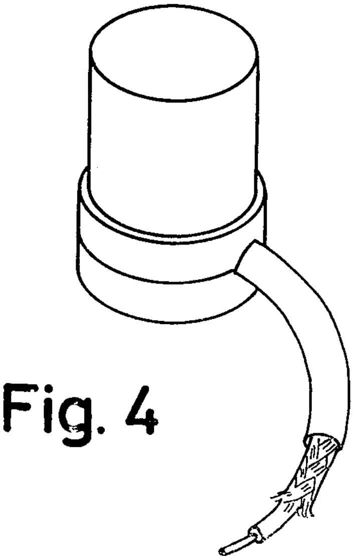
FIG. 4 shows a perspective view of a finished accelerometer.

The accelerometer consists of base (1), to which is affixed the inverted T-shaped stud (2) which is press fit into the groove (9). The stud (2) carries two flat piezoelectric elements (3) with associated flat-faced seismic masses (4), the whole assembly being held in it's place by means of the spring clip or cylinder (5). A coaxial cable is brought through the bores (6) and (8), the inner conductor being electrically connected to the conducting seismic masses (4) or the spring clip (5), and the outer conductor to the base (1). The housing (7) is pressed onto the base (1) , thereby at the same time accomplishing permanent fixture of the stud and closure of the accelerometer.

The accelerometer shown is designed to react to the acceleration of a linear motion, for which reason the piezoelectric elements (3) have been polarized in a direction parallel to the axis of the stud. The base (1) is fastened to the body, the acceleration of which is to be measured, and thus follows the movements of said body. Inertial forces appear between the stud (2) and the seismic bodies (4). The forces are proportional to the seismic masses and to the acceleration of the base. The forces due to motion in an axial direction subject the piezo-electric elements to shear, bringing about an electrical charge that is proportional to the acceleration. This charge is measured by means of the associated equipment. Forces due to accelerations at right angles to the axis will only develop an electrical charge in case the surfaces of the stud are not exactly parallel to the axis. Similarly in case the direction of polarization of the piezo-electric elements is not exatly parallel to the axis.

If the piezo-electric elements are mounted with the directions of polarization perpendicular to the axis and in opposite directions one obtains an accelerometer that is sensitive to the angular acceleration in a rotational motion about the axis.

The configuration shown allows one to use precisely machined surfaces between the mechanical details and the piezo-electric elements. This is not possible in the hitherto known, cemented types. The use of precision machining together with the pre-tensioning function of the spring make for an improved linearity as well as for a slightly higher sensitivity and resonance frequency and lessened sensitivity to bending of the base.

I claim:

1. An electromechanical force transducer comprising: a base including a base piece and a rectangular stud, having opposed flat faces, fixed in the base piece; a plurality of shear sensitive transducing elements, with flat faces, and associated seismic masses, with flat faces, fixed to the opposing faces of the stud by means of a clamping force directed toward the axis of the stud, the flat faces of said measuring elements being disposed in planar abutment with associated said flat faces of said seismic masses and said stud, said measuring elements being subjected to shear by the forces to be measured, thereby displaying a change in electrical charge, voltage, current, or impedance; said stud having a rectangular cross-section and press fit into a complementary recess in the base piece, the part of the stud fixed in the base piece being wider but of the same thickness as the part of the stud carrying the measuring elements; all of the surfaces of said abutting flat faces of the stud, the elements and the seismic masses being precisely machined; and clip means embracing and engaging the seismic masses and providing said clamping force and sandwiching and maintaining under even pressure each element in flat precisely machined surface contact with and between its associated mass and an associated face of the stud.

2. An electromechanical force transducer according to claim 1, wherein a housing encloses said stud, elements and seismic masses and is joined to the base piece by a press fit.

3. An electromechanical force transducer according to claim 1, in which the stud is an inverted T-shaped with the T-bar part being press fit into the recess in the base piece, said recess being a slot.

4. An electromechanical force transducer according to claim 3, wherein said base piece is a stepped cylindrical member having an upper section of less diameter than its lower section and the upper section is diametrically slotted to provide the recess for said stud; said clip means is a circular spring clip disposed around the upstanding T-leg part of said stud and maintaining said seismic masses and elements in predetermined assembly orientation on each side face of the stud T-leg.

* * * * *